United States Patent
Liu

(10) Patent No.: US 9,905,215 B2
(45) Date of Patent: Feb. 27, 2018

(54) NOISE CONTROL METHOD AND DEVICE

(71) Applicant: Beijing Zhigu Rui Tuo Tech Co., Ltd, Beijing (CN)

(72) Inventor: Jia Liu, Beijing (CN)

(73) Assignee: BEIJING ZHIGU RUI TUO TECH CO., LTD, Beijing (CN)

( * ) Notice: Subject to any disclaimer, the term of this patent is extended or adjusted under 35 U.S.C. 154(b) by 0 days.

(21) Appl. No.: 15/117,166

(22) PCT Filed: Dec. 29, 2014

(86) PCT No.: PCT/CN2014/095282
§ 371 (c)(1),
(2) Date: Aug. 5, 2016

(87) PCT Pub. No.: WO2015/135364
PCT Pub. Date: Sep. 17, 2015

(65) Prior Publication Data
US 2016/0379613 A1    Dec. 29, 2016

(30) Foreign Application Priority Data

Mar. 10, 2014  (CN) .......................... 2014 1 0085459

(51) Int. Cl.
G10K 11/16    (2006.01)
H04N 5/60     (2006.01)
(Continued)

(52) U.S. Cl.
CPC ............. *G10K 11/16* (2013.01); *G06F 3/165* (2013.01); *H03G 3/32* (2013.01); *H04N 5/60* (2013.01);
(Continued)

(58) Field of Classification Search
None
See application file for complete search history.

(56) References Cited

U.S. PATENT DOCUMENTS 5,666,426 A   9/1997  Helms
7,149,512 B2  12/2006 Connor
(Continued)

FOREIGN PATENT DOCUMENTS

CN    1747320 A    3/2006
CN    1897054 A    1/2007
(Continued)

OTHER PUBLICATIONS

International Search Report for PCT Application No. PCT/CN2014/095276, dated Apr. 3, 2015, 3 pages.
(Continued)

*Primary Examiner* — Curtis Kuntz
*Assistant Examiner* — Kenny Truong
(74) *Attorney, Agent, or Firm* — Amin, Turocy & Watson, LLP

(57) ABSTRACT

A noise control method and device are provided that relate to the field of noise control. A noise control method includes: acquiring noise information of an ambient environment; and judging whether the noise information satisfies a predetermined condition, and if so, sending a noise control message to another device, the noise control message being used to notify the other device to adjust a volume. Another noise control method includes: receiving, by a device, a noise control message from an external device; and adjusting a volume based on a volume adjustment policy according to the noise control message and a current volume of the device. The noise control method and device in the embodiments of the present application may easily and quickly realize control over ambient noise, thereby improving user experience.

51 Claims, 12 Drawing Sheets

(51) Int. Cl.
*H03G 3/32* (2006.01)
*G06F 3/16* (2006.01)
*H04Q 9/00* (2006.01)
*G10K 11/16* (2006.01)

(52) U.S. Cl.
CPC ......... *H04Q 9/00* (2013.01); *H04Q 2209/823* (2013.01)

(56) References Cited

U.S. PATENT DOCUMENTS

| | | | |
|---|---|---|---|
| 8,422,952 B2 | 4/2013 | Sato et al. | |
| 2003/0123680 A1* | 7/2003 | Lee | G06F 3/165 381/104 |
| 2005/0282590 A1 | 12/2005 | Haparnas | |
| 2007/0165834 A1 | 7/2007 | Redman et al. | |
| 2008/0085007 A1 | 4/2008 | Engelbrecht et al. | |
| 2010/0048131 A1 | 2/2010 | Hirsch et al. | |
| 2011/0051016 A1* | 3/2011 | Malode | H03G 1/02 348/734 |
| 2011/0211712 A1* | 9/2011 | Yamada | H03G 3/002 381/109 |
| 2012/0039489 A1 | 2/2012 | Chen et al. | |
| 2014/0321680 A1* | 10/2014 | Takahashi | H04S 7/304 381/303 |

FOREIGN PATENT DOCUMENTS

| | | |
|---|---|---|
| CN | 101001274 A | 7/2007 |
| CN | 101079938 A | 11/2007 |
| CN | 101114818 A | 1/2008 |
| CN | 101562671 A | 10/2009 |
| CN | 102118665 A | 7/2011 |
| CN | 102158606 A | 8/2011 |
| CN | 102638602 A | 8/2012 |
| CN | 202383998 U | 8/2012 |
| CN | 102710838 A | 10/2012 |
| CN | 102761721 A | 10/2012 |
| CN | 102883121 A | 1/2013 |
| CN | 102915753 A | 2/2013 |
| CN | 103024630 A | 4/2013 |
| CN | 103138883 | 6/2013 |
| CN | 103138883 A | 6/2013 |
| CN | 103220600 A | 7/2013 |
| CN | 103383447 A | 11/2013 |
| CN | 103595849 A | 2/2014 |
| CN | 103634168 A | 3/2014 |
| CN | 103886731 A | 6/2014 |
| CN | 103886857 A | 6/2014 |
| CN | 103903606 A | 7/2014 |
| DE | 3220758 A1 | 12/1983 |
| JP | H04195000 A | 7/1992 |
| JP | H05211450 A | 8/1993 |
| JP | 2005295272 A | 10/2005 |
| JP | 2006270601 A | 10/2006 |
| JP | 2007142815 A | 6/2007 |
| JP | 2012039492 A | 2/2012 |
| WO | 241489 A3 | 12/2002 |

OTHER PUBLICATIONS

International Search Report for PCT Application No. PCT/CN2014/095319, dated Mar. 27, 2015, 3 pages.
International Search Report for PCT Application No. PCT/CN2014/095282, dated Apr. 3, 2015, 3 pages.
Office Action for U.S. Appl. No. 15/117,172 dated Jul. 19, 2017, 29 pages.
Office Action for U.S. Appl. No. 15/117,182 dated Jun. 29, 2017, 37 pages.
Office Action for U.S. Appl. No. 15/117,172 dated Dec. 28, 2017, 36 pages.

* cited by examiner

NOISE CONTROL METHOD AND DEVICE

RELATED APPLICATION

The present application is a U.S. National Stage filing under 35 U.S.C. § 371 of international patent cooperation treaty (PCT) application No. PCT/CN2014/095282, filed Dec. 29, 2014, and entitled "NOISE CONTROL METHOD AND DEVICE", which claims the benefit of priority to Chinese Patent Application No. 201410085459.6, filed on Mar. 10, 2014, which applications are hereby incorporated into the present application by reference herein in their respective entireties.

TECHNICAL FIELD

The present application relates to the field of noise control technologies, and in particular, to a noise control method and device.

BACKGROUND

Noise pollution is a problem that people often encounter in everyday life. Generally, sounds that affect people's work, study and rest are called noise.

More and more electronic devices, while enriching people's everyday life, also bring about new noise pollution problems. For example, when a user is having a rest in the bedroom, perhaps other family members are watching TV in the living room, and at this time, if a sound that the TV set makes is too loud, the sound easily becomes noise, affecting the user's rest. For another example, when a user is listening to music through an audio system, at this time, the phone rings, and the user answers the phone and finds that the sound of the audio system is too loud, affecting the user's normal answering of the phone.

In the foregoing scenarios, the user often manually controls the volume key of the TV set or the audio system to adjust a volume, and then noise interference may be avoided, which has cumbersome steps and poor user experience.

SUMMARY

An example objective of the present application is to provide a noise control method and device.

In a first example aspect, an embodiment of the present application provides a noise control method, and the method includes:

acquiring noise information of an ambient environment; and judging whether the noise information satisfies a predetermined condition, and if yes, sending a noise control message to other devices, the noise control message being configured to notify the other devices to adjust a volume.

In a second example aspect, an embodiment of the present application provides a noise control method, and the method includes:

receiving, by a device, a noise control message from an external device; and adjusting a volume based on a volume adjustment policy according to the noise control message and a current volume of the device.

In a third example aspect, an embodiment of the present application provides a noise controlling device, and the device includes:

an acquisition module, configured to acquire noise information of an ambient environment;

a judgment module, configured to judge whether the noise information satisfies a predetermined condition; and a sending module, configured to send a noise control message to other devices if the noise information satisfies the predetermined condition, the noise control message being configured to notify the other devices to adjust a volume.

In a fourth example aspect, an embodiment of the present application provides a noise controlled device, and the device includes:

a receiving module, configured to receive a noise control message from an external device; and an adjustment module, configured to adjust a volume based on a volume adjustment policy according to the noise control message and a current volume of the device.

Noise control methods and devices in the embodiments of the present application may easily and quickly realize control over ambient noise, thereby improving user experience.

DETAILED DESCRIPTION

Embodiments of the present application are further described in detail hereinafter with reference to the accompanying drawings and embodiments. The following embodiments are intended to describe the present application, but not to limit the scope of the present application.

Those skilled in the art should understand that, in the embodiments of the present application, sequence numbers of steps do not mean an order of execution, and the order of execution of the steps should be determined according to functions and internal logic thereof, but should not pose any limitation to the implementation process of the implementations of the present application.

In addition, the terms such as "first" and "second" in the embodiments of the present application are merely used to distinguish different steps, devices or modules, which neither represent any specific technical meaning nor represent a necessary logical order between them.

The term "noise" in the present application refers to sounds that affect people's work, study and rest, which has relativity, for example, when a user makes a call, voices, music, whistles and the like around the user may become noise.

During research, the inventor has found that, before a user enters into a sound sensitive state, the user may often perform regular operations on a portable electronic device. For example, before going to bed, the user may adjust the mobile phone to a silent mode. For another example, before answering the phone, the user may press the answer key. Therefore, according to the user's operating habits, the corresponding electronic device (for example, a mobile phone) may previously know that the user will enter into a sound sensitive state, so as to notify surrounding electronic devices which are making a sound to reduce the volume in advance, thereby avoiding interference with the user.

Figure 1:
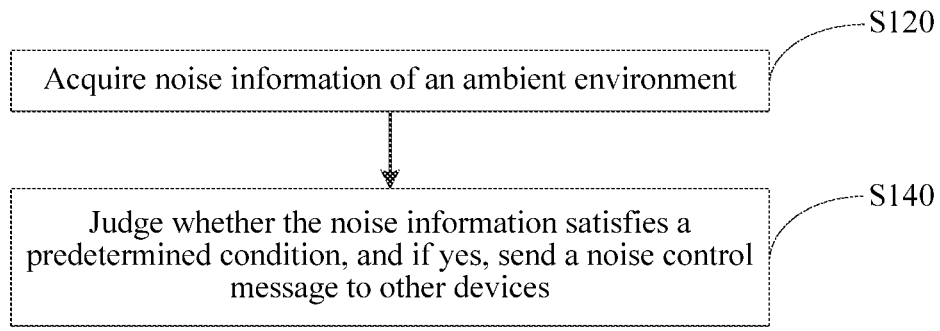
FIG. 1 is an example flowchart of a noise control method according to an embodiment of the present application.

FIG. 1 is a flowchart of a noise control method according to an embodiment of the present application; the method may be executed by, for example, a noise controlling device, as shown in FIG. 1, and the method includes:

S120: acquiring noise information of an ambient environment; and

S140: judging whether the noise information satisfies a predetermined condition, and if yes, sending a noise control message to other devices, the noise control message being configured to notify the other devices to adjust a volume.

According to the noise control method in the embodiment of the present application, noise information is acquired from noise in an ambient environment, and in the case that the noise information satisfies a predetermined condition, the noise control message is automatically sent to other devices, so as to notify the other devices to adjust a volume, thereby easily and quickly realizing control over ambient noise and improving user experience.

Functions of the steps S120 and S140 are described below in detail.

In an example implementation, in the step S120, the noise information includes: a noise intensity value. The noise intensity value refers to information that can reflect intensity of noise in an ambient environment, for example, it may be a noise sound pressure level, a noise signal intensity, or the like.

In an example implementation, in the step S140, the satisfying a predetermined condition includes that: the noise intensity value is greater than a predetermined threshold. The predetermined threshold may be set by a user, for example, a setting interface is output, and the predetermined threshold is set according to an input value of the user. Alternatively, the predetermined threshold may be automatically set according to the user's current sensitivity to noise, for example, when the user adjusts a mobile phone to a silent mode, it indicates that the user may want to sleep next, and the predetermined threshold is automatically set to 10 dB; when the user presses an answer key of a mobile phone, the predetermined threshold is automatically set to 20 dB.

In the present application, the adjusting the volume mainly means adjusting the volume from high to low; the present application does not define the specific adjustment manner, for example, the adjustment may be made by performing filtering on an output end, and the adjustment may also be made by modifying a volume value in an audio signal.

In an example implementation, the other devices that receive the noise control message may reduce their volume upon receipt of the noise control message, for example, each device reduces the volume by 10 dB each time. The implementation is mainly applicable to a situation where there are a small number of the other devices, for example, in the user's home, in addition to the mobile phone, only a TV set may produce noise impacts on the user. Through presetting, the TV set may automatically reduce the volume by 10 dB each time it receives the noise control message sent by the mobile phone. The reducing the volume in the present application includes reducing the volume to 0 dB, that is, the devices are shut down or muted.

In an example implementation, the other devices may be a plurality of separate sounding devices, and in the step S140, preferably, the noise control message is sent to the other devices through broadcasting. In this case, because the current volume of respective sounding devices and distances from the sounding devices to a sender of the noise control message are not completely the same, noise impacts caused by some sounding devices are great, while noise impacts caused by some sounding devices are small, it is not reasonable to let all sounding devices lower the volume by the same level, for example, some sounding devices have low volume and small noise impacts, and they may be muted after the volume is lowered, affecting normal use of other users. In this case, if corresponding information is transmitted to the other devices through the noise control message, the other devices may decide how much the volume is lowered according to their own situations, thereby further improving user experience.

In an example implementation, the noise control message may include: the noise intensity value, the predetermined threshold and a transmit power value of the noise control message.

In an example implementation, the noise control message may include: the noise intensity value, the predetermined threshold and position information of a sender of the noise control message.

In an example implementation, the noise control message may include: the noise intensity value, the predetermined threshold, noise sampling information and a corresponding sampling time. The noise sampling information and the sampling time may be acquired during acquisition of the noise information, that is to say, the noise information acquired from the noise of the ambient environment includes the noise sampling information and the sampling time. The noise sampling information may be an original noise sampling fragment or a processed noise sampling feature.

How the other devices use information included in the noise control message to adjust a volume will be described hereinafter, which is not repeated herein.

The noise information in the present application may be noise information corresponding to all collected sound frequencies. In addition, in another example implementation, the noise information may also be noise information of some specific sound frequency intervals, that is, noise information of at least one sound frequency interval. The implementation is mainly applicable to a situation where the user is relatively sensitive to noise in a specific sound frequency interval, for example, when the user is thinking, in terms of voices of character dialogues from a TV set and music from an audio system, the user may be more sensitive to the voices of dialogues. Therefore, the mobile phone of the user may acquire noise information of a sound frequency interval (for example, 300 HZ to 3400 HZ) corresponding to the voices of character dialogues from the noise of the ambient environment according to the user's habits, and then judgment and message sending tasks in the step S140 are executed.

Figure 2:
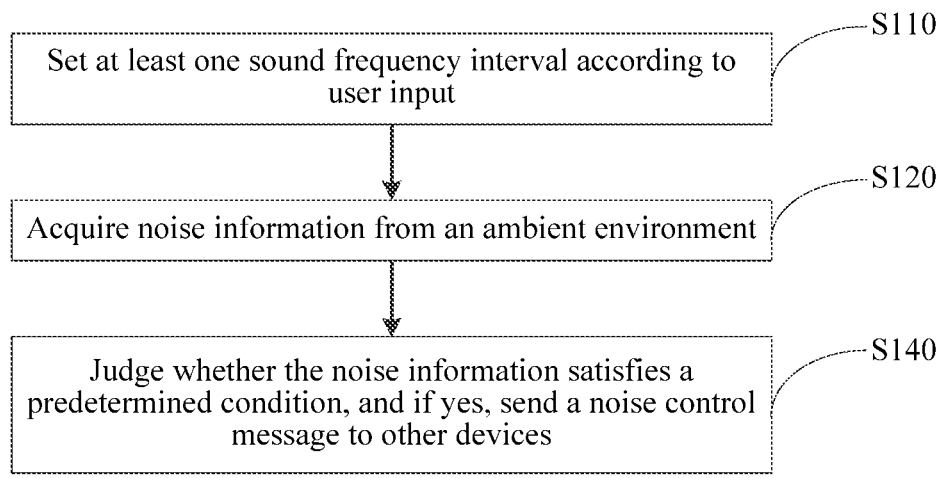
FIG. 2 is an example flowchart of a noise control method in an implementation according to an embodiment of the present application.

In addition, in another example implementation, the sound frequency interval may be set by the user; as shown in FIG. 2, the method may further include:

S110: setting at least one sound frequency interval according to user input.

In addition, the embodiments of the present application also provide a computer readable medium, comprising computer readable instructions which perform the following operations when being executed: executing the operations of steps S120 and S140 of the method in the example implementation shown in FIG. 1.

To sum up, according to the noise control method in the example implementation, judgment may be made according to noise information of an ambient environment, the noise control message is sent to other devices if the adjustment is satisfied, and corresponding information may be transmitted through the noise control message, so that the other devices make out a volume adjustment policy according to their own situations, thereby simplifying noise control steps and improving user experience.

Figure 3:
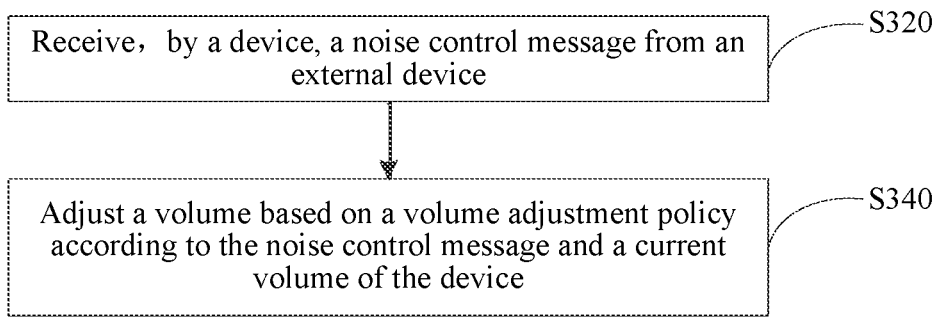
FIG. 3 is an example flowchart of a noise control method according to an embodiment of the present application.

FIG. 3 is a flowchart of a noise control method according to another embodiment of the present application; the method may be executed by, for example, a noise controlled device, as shown in FIG. 3, and the method includes:

S320: receiving, by the device, a noise control message from an external device; and S340: adjusting a volume based on a volume adjustment policy according to the noise control message and a current volume of the device.

According to the method in this embodiment, a noise control message is received from an external device, and a volume is adjusted based on a volume adjustment policy according to the noise control message and a current volume of the device, so that the volume may be adjusted automatically according to a request from the external device, thereby reducing noise output, simplifying noise control steps, and improving user experience.

Functions of the steps S320 and S340 are described below in detail.

In an example implementation, in the step S320, the noise control message sent by the external device may be received wirelessly, so as to be convenient for the user to move a sender device of the message.

Figure 4:
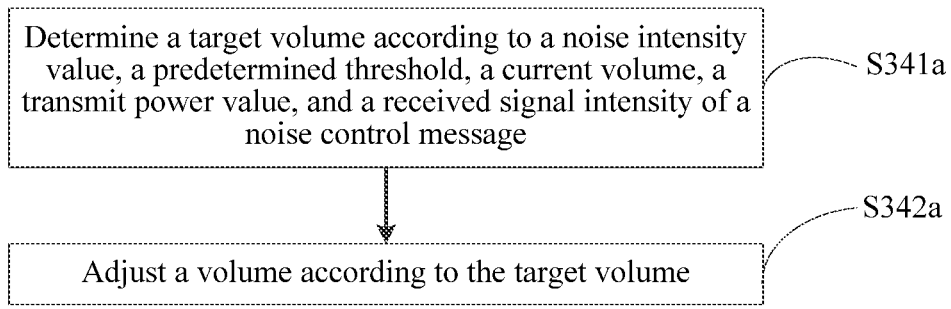
FIG. 4 is an example flowchart of step S340 in an implementation according to an embodiment of the present application.

In an example implementation, the noise control message includes: a noise intensity value, a predetermined threshold and a transmit power value of the noise control message. Moreover, referring to FIG. 4, the step S340 includes:

S341a: determining a target volume according to the noise intensity value, the predetermined threshold, the current volume, the transmit power value and received signal intensity of the noise control message; and S342a: adjusting the volume according to the target volume.

The target volume in the present application is a target value after adjustment of the volume. In the step S342a, the volume may be directly adjusted to the target volume.

Figure 5:
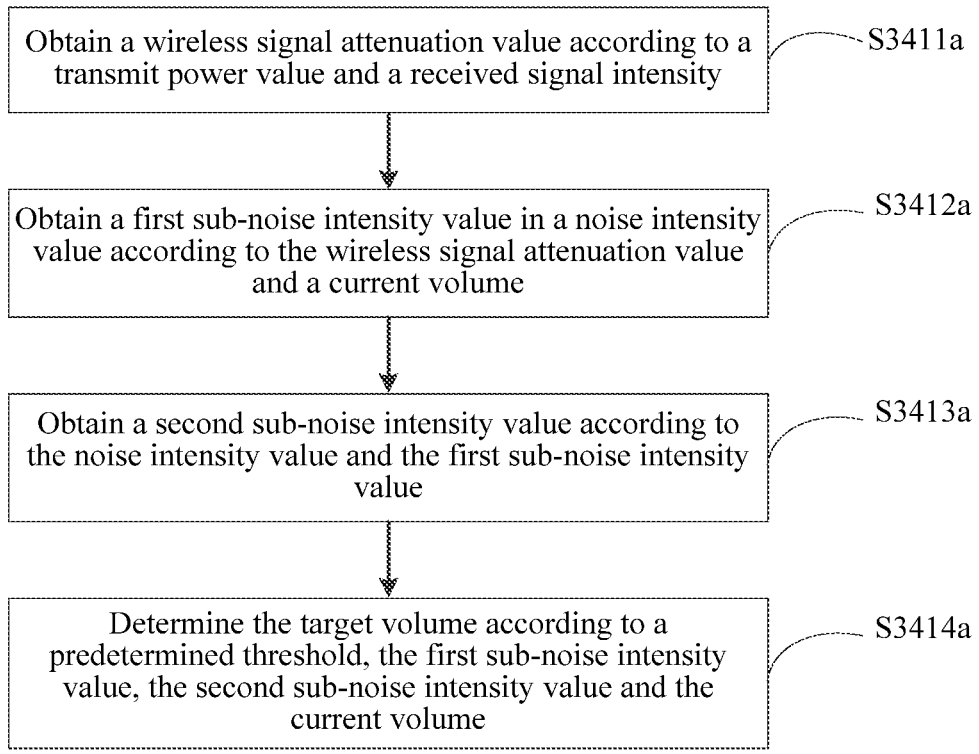
FIG. 5 is an example flowchart of step S341a in an implementation according to an embodiment of the present application.

Specifically, in an example implementation, referring to FIG. 5, the step S341a may include:

S3411a: obtaining a wireless signal attenuation value according to the transmit power value and the received signal intensity;

S3412a: obtaining a first sub-noise intensity value in the noise intensity value according to the wireless signal attenuation value and the current volume;

S3413a: obtaining a second sub-noise intensity value according to the noise intensity value and the first sub-noise intensity value; and S3414a: determining the target volume according to the predetermined threshold, the first sub-noise intensity value, the second sub-noise intensity value and the current volume.

In an example implementation, the step S3412a may include:

S34121a: determining an intermediate parameter according to the wireless signal attenuation value, where the intermediate parameter may be a parameter capable of associating the wireless signal attenuation value and a sound signal attenuation value, for example, the intermediate parameter may be a distance; and S34122a: obtaining the first sub-noise intensity value in the noise intensity value according to the intermediate parameter and the current volume.

In the present application, the noise intensity value may include: a noise sound pressure level or a noise signal intensity, which reflects information of intensity of noise at the external device. The first sub-noise intensity value reflects a contribution value of a sound output by a current noise source (that is, a current sounding device) for intensity of noise at the external device; the second sub-noise intensity value reflects a contribution value of a sound output by another noise source (that is, another sounding device) for the intensity of the noise at the external device. Correspondingly, when the noise intensity value is the noise sound pressure level, the first sub-noise intensity value is a first sub-noise sound pressure level, and the second sub-noise intensity value is a second sub-noise sound pressure level; when the noise intensity value is the noise signal intensity, the first sub-noise intensity value is a first sub-noise signal intensity, and the second sub-noise intensity value is a second sub-noise signal intensity. For the sake of simplicity, the following description is given merely by illustrating the situation where the noise intensity value is the noise sound pressure level.

Suppose that the transmit power value of the noise control message is Lt, the received signal intensity of the noise control message is Lr, the current volume is Lc, the noise sound pressure level at the external device is $Lp_0$, and the predetermined threshold is Lp.

The wireless signal attenuation value $Ld_1$ may be obtained according to the step S3411a:

$$Ld_1=Lt-Lr.$$

For the sake of simplicity, it is considered that attenuation of a wireless signal is merely related to a propagation distance of the signal, and suppose that the propagation distance of the signal and an attenuation value of the wireless signal have a first function relationship therebetween, a distance D between the device and the external device may be obtained according to the step S34121a:

$$D=f_1(Ld_1);$$

where $f_1$ denotes the first function relationship.

For the sake of simplicity, it is considered that attenuation of a sound is merely related to a propagation distance of the sound, and suppose that an attenuation value of the sound and the propagation distance thereof have a second function relationship therebetween, an attenuation value $Ld_2$ of the sound after passing through the distance may be obtained according to the step S34122a:

$$Ld_2=f_2(D);$$

where $f_2$ denotes the second function relationship.

Further, according to the current volume, the first sub-noise sound pressure level $Lp_1$ at the external device may be obtained:

$$Lp_1=Lc-Ld_2;$$

in the step S3413a, suppose that the second sub-noise sound pressure level is $Lp_2$, there is a formula according to sound intensity superposition:

$$Lp_0 = 10 \times 1\text{g}\left(10^{\frac{Lp_1}{10}} + 10^{\frac{Lp_2}{10}}\right);$$

$Lp_2$ may be obtained through calculation according to the formula.

In the step S3414a, first suppose that other noise sources may not adjust the volume and also suppose that the first sub-noise sound pressure level after adjustment of the volume is $Lp_1'$, according to the predetermined threshold Lp and the second sub-noise sound pressure level $Lp_2$, there is a formula according to sound intensity superposition:

$$Lp = 10 \times 1\text{g}\left(10^{\frac{Lp_1'}{10}} + 10^{\frac{Lp_2}{10}}\right);$$

$Lp_1'$ may be obtained through calculation according to the formula.

Further, the target volume La may be obtained according to the current volume Lc and the first sub-noise sound pressure levels $Lp_1$ and $Lp_1'$ before and after adjustment of the volume:

$$La=Lc-(Lp_1-Lp_1').$$

Those skilled in the art should understand that, in the step S3414a, in determination of the target volume, it may also be assumed that the other noise sources may adjust the volume, for example, it may be assumed that the second sub-noise sound pressure level after adjustment of the other noise sources is $Lp_2'=Lp_2 \times 50\%$.

Figure 6:
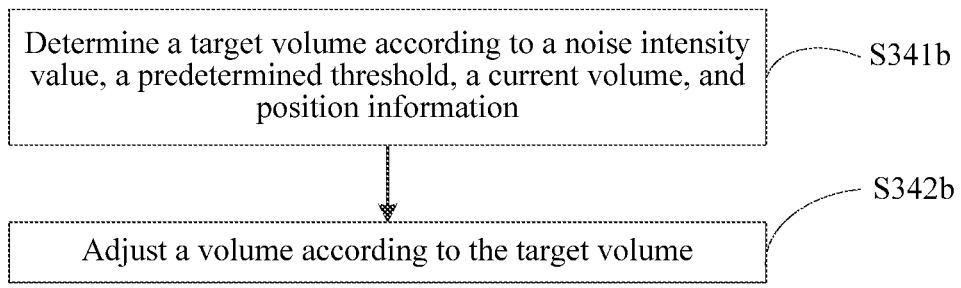
FIG. 6 is an example flowchart of step S340 in an implementation according to an embodiment of the present application.

In an example implementation, the noise control message includes: a noise intensity value, a predetermined threshold and position information. The position information is position information of the external device. Moreover, referring to FIG. 6, the step S340 includes:

S341b: determining a target volume according to the noise intensity value, the predetermined threshold, the current volume, and the position information; and S342b: adjusting the volume according to the target volume.

Figure 7:
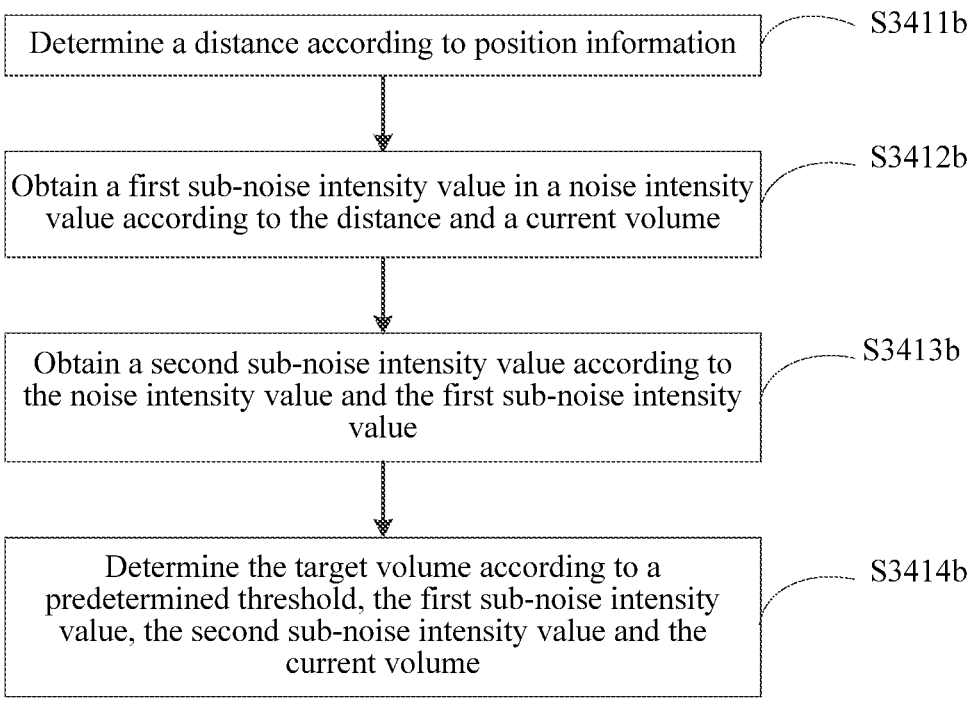
FIG. 7 is an example flowchart of step S341b in an implementation according to an embodiment of the present application.

Specifically, referring to FIG. 7, in an implementation, the step S341b may include:

S3411b: determining a distance according to the position information;

S3412b: obtaining a first sub-noise intensity value in the noise intensity value according to the distance and the current volume;

S3413b: obtaining a second sub-noise intensity value according to the noise intensity value and the first sub-noise intensity value; and S3414b: determining the target volume according to the predetermined threshold, the first sub-noise intensity value, the second sub-noise intensity value and the current volume.

In the step S3411b, the distance is a distance between the device and the external device. The current sounding source (the device) may acquire its own position information through indoor positioning or other technologies, and a distance between the current sounding source and the external device may be obtained in combination with position information of the external device.

The example implementation process of the steps S3412b-S3414b is similar to that of the steps S3412a, S3413a and S3414a in the previous example implementation, which is not repeated herein.

Figure 8:
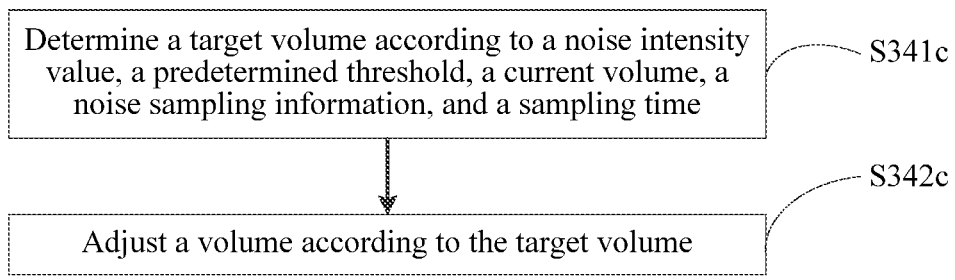
FIG. 8 is an example flowchart of step S340 in an implementation according to an embodiment of the present application.

In an example implementation, the noise control message includes: a noise intensity value, a predetermined threshold, noise sampling information and a corresponding sampling time. Moreover, referring to FIG. 8, the step S340 includes:

S341c: determining a target volume according to the noise intensity value, the predetermined threshold, the current volume, the noise sampling information and the sampling time; and S342c: adjusting the volume according to the target volume.

Figure 9:
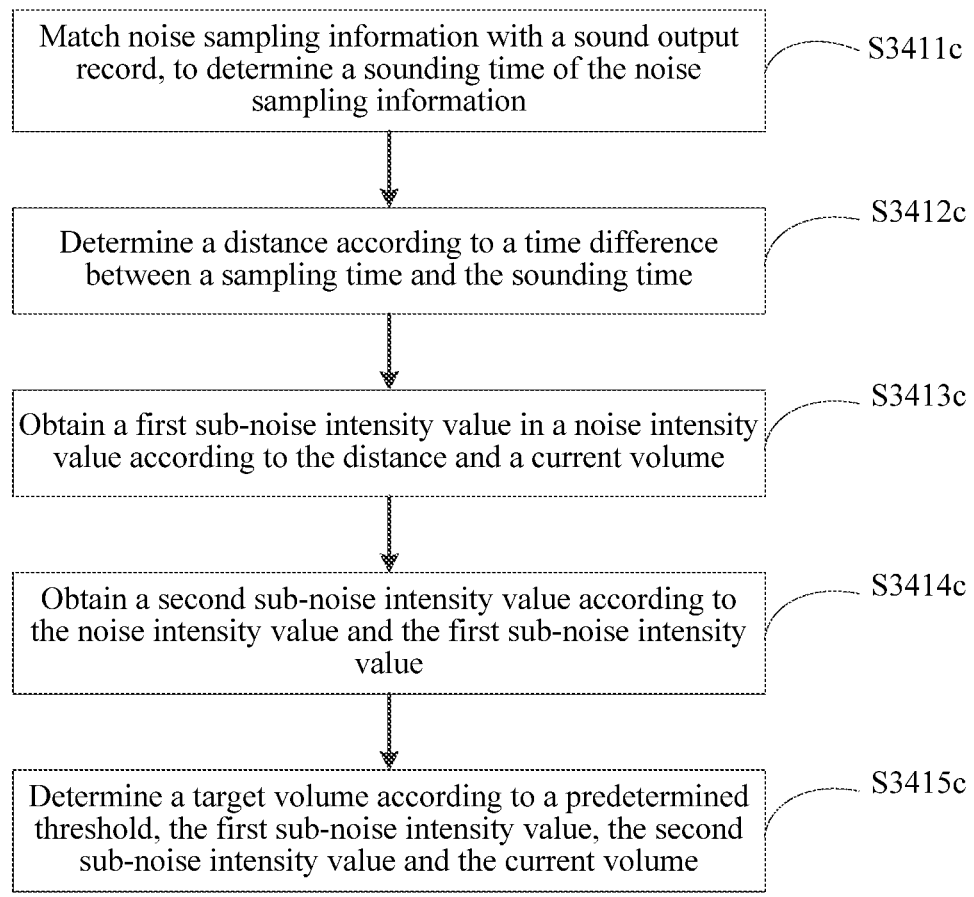
FIG. 9 is an example flowchart of step S341c in an implementation according to an embodiment of the present application.

Specifically, in an example implementation, referring to FIG. 9, the step S341c may include:

S3411c: matching the noise sampling information with a sound output record of the device, to determine a sounding time of the noise sampling information;

S3412c: determining a distance according to a time difference between the sampling time and the sounding time;

S3413c: obtaining a first sub-noise intensity value in the noise intensity value according to the distance and the current volume;

S3414c: obtaining a second sub-noise intensity value according to the noise intensity value and the first sub-noise intensity value; and S3415c: determining the target volume according to the predetermined threshold, the first sub-noise intensity value, the second sub-noise intensity value and the current volume.

In the step S3411c, the noise sampling information may be a recording of ambient noise, that is, a noise sampling fragment, and may also be a noise sampling feature (such as a spectral feature) obtained through extraction after processing on the noise sampling fragment. For the sake of simplicity, the following description about the step S3411c is merely based on the situation where the noise sampling information is a noise sampling fragment (when the noise sampling information is a noise sampling feature, the following steps a and b may be omitted during processing on the noise sampling information).

In an example implementation, the step S3411c may include:

a) dividing an audio signal to be processed into a plurality of frames;

b) extracting features of audio signals of each frame, the features include, but are not limited to, Fourier coefficients, Mel-frequency Cepstral Coefficients (MFCCs), spectral flatness, spectral sharpness, Linear Predictive Coding coefficients and the like;

c) compressing the extracted features by using a classification algorithm, to form a sub-fingerprint corresponding to each frame;

d) taking the noise sampling information as the audio signal to be processed to execute the steps a-c, to obtain a plurality of sub-fingerprints corresponding to the noise sampling information, the plurality of sub-fingerprints forming a fingerprint block; and taking a sound output of the device as the audio signal to be processed to execute the steps a-c, to obtain a plurality of sub-fingerprints corresponding to the sound output, the plurality of sub-fingerprints forming a fingerprint stream; and e) comparing similarity between different parts of the fingerprint block and the fingerprint stream, so as to judge whether they match each other; when the similarity is greater than a predetermined value, it may be considered that they match each other, and a sounding time of the noise sampling information may be obtained in the case that they match each other.

Reference may be made to Jaap Haitsma and Antonius Kalker et al.'s Paper "A Highly Robust Audio Fingerprinting System", International Symposium on Music Information Retrieval (ISMIR) 2002, pp. 107-115, for example implementation of the steps a-e. This is not the focus of the present application, and is not repeated herein.

In the step S3412c, the distance is a distance between the device and the external device. A time difference may be obtained according to the sampling time and the sounding time, and then a distance between the device and the external device may be obtained in combination with a propagation speed of the sound in the air.

The example implementation process of the steps S3413c-S3415c is similar to that of the steps S3412b-S3414b in the previous example implementation, which is not repeated herein.

Figure 10:
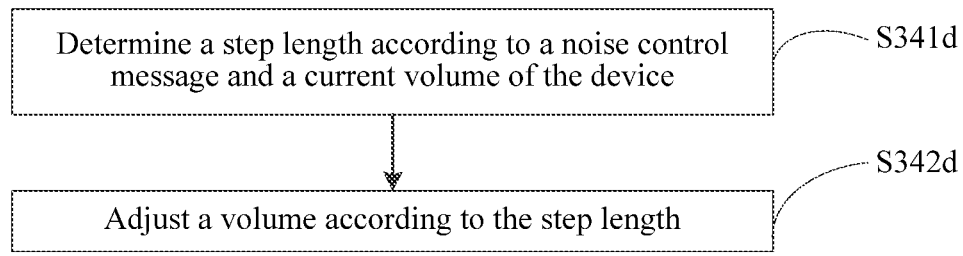
FIG. 10 is an example flowchart of step S340 in an implementation according to an embodiment of the present application.

Referring to FIG. 10, in an example implementation, the step S340 includes:

S341d: determining a step length according to the noise control message and a current volume of the device; and S342d: adjusting the volume according to the step length.

In order to better implement the method in the example implementation, the method in the implementation may be executed cyclically, that is, each time the noise control message is received, the step S340 is executed once, until the noise control message is no longer received. The step length may be a fixed value, and may also be a non-fixed value. The step length may be set with reference to the current volume, for example, when the current volume is great, a large step length is set, and when the current volume is small, a small step length is set.

For example, when the noise control message is received for the first time, the current volume is 80 dB, the step length is determined to be −20 dB, and the adjusted volume is 60 dB; when the noise control message is received for the second time, the current volume is 60 dB, the step length is determined to be −8 dB, and the adjusted volume is 52 dB; when the noise control message is received for the third time, the current volume is 52 dB, the step length is determined to be −5 dB, and the adjusted volume is 47 dB.

Figure 11:
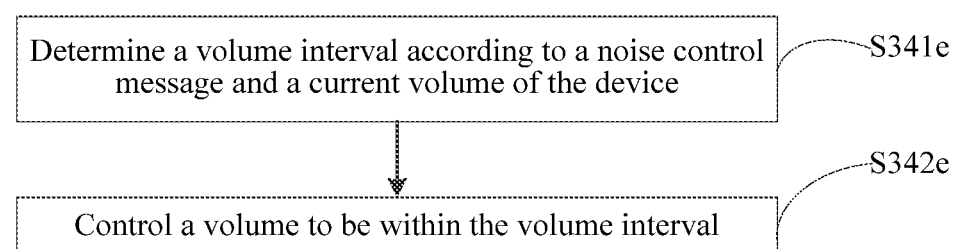
FIG. 11 is an example flowchart of step S340 in an implementation according to an embodiment of the present application.

Referring to FIG. 11, in an example implementation, the step S340 includes:

S341e: determining a volume interval according to the noise control message and a current volume of the device; and S342e: controlling the volume to be within the volume interval.

In the example implementation, reference may be made to a predetermined proportion of the current volume for determination of the volume interval, for example, an upper limit of the volume interval may be set to 50% of the current volume, a lower limit is set to 0, and suppose that the current volume is 80 dB, the volume interval determined in the step S341e is [40, 0].

According to the method in the example implementation, merely output volume of an audio signal beyond a volume interval may be adjusted, so as to avoid the situation where the output volume of a part with a smaller volume value in the audio signal is 0 after adjustment to result in that other uses cannot hear totally.

Figure 12:
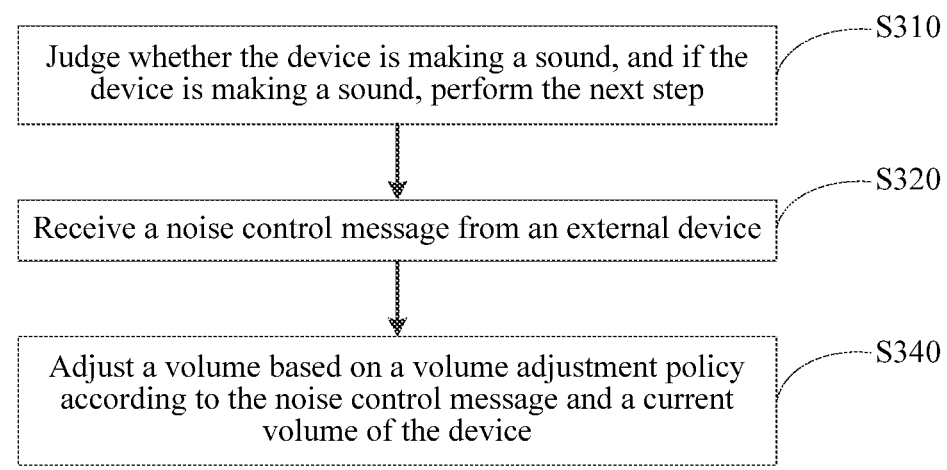
FIG. 12 is an example flowchart of a noise control method in an implementation according to an embodiment of the present application.

In consideration of demands for saving energy, the method does not need to be executed all the time after a device has been turned on, but only needs to be executed when the device is in a sounding state. Therefore, referring to FIG. 12, in another example implementation of the present application, the method further includes:

S310: judging whether the device is making a sound, and if the device is making a sound, performing the step of receiving a noise control message from the external.

In addition, the embodiments of the present application also provide a computer readable medium, comprising computer readable instructions which perform the following operations when being executed: executing the operations of steps S320 and S340 of the method in the example implementation shown in FIG. 3.

To sum up, according to the noise control method in this embodiment, after a noise control message is received, a target volume, a step length or a volume interval may be determined according to related information in the message and the current volume of the device, and then corresponding volume adjustment is made, so as to easily and quickly realize control over ambient noise, thereby improving user experience.

Figure 13:
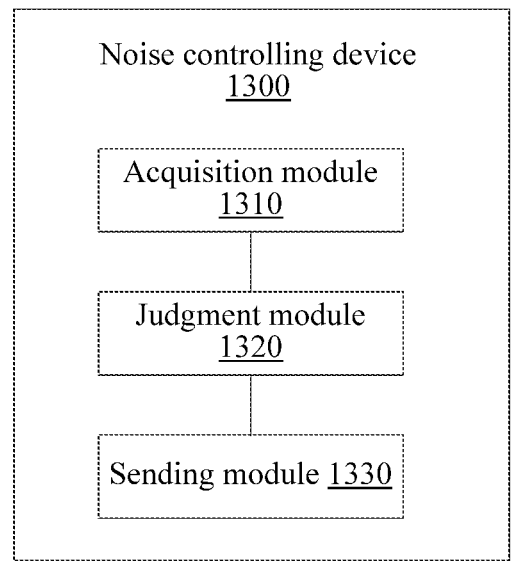
FIG. 13 is an example schematic structural diagram of a noise controlling device according to an embodiment of the present application.

FIG. 13 is a schematic diagram of a modular structure of a noise controlling device according to an embodiment of the present application. The noise controlling device may generally be a device carried by a user, for example, a smart phone, a smart watch, smart glasses, a smart ring, or other devices. The devices are carried by the user, noise information acquired by the devices is closer to noise that the user feels with ears.

As shown in FIG. 13, the device 1300 includes:

an acquisition module 1310, configured to acquire noise information of an ambient environment;

a judgment module 1320, configured to judge whether the noise information satisfies a predetermined condition; and a sending module 1330, configured to send a noise control message to other devices if the noise information satisfies the predetermined condition, the noise control message being configured to notify the other devices to adjust a volume.

Figure 14:
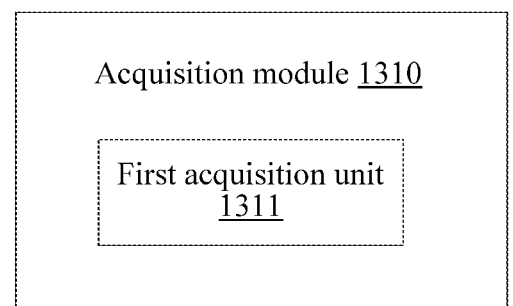
FIG. 14 is an example schematic diagram of a modular structure of an acquisition module in an implementation according to an embodiment of the present application.

Referring to FIG. 14, in an example implementation, the noise information includes: a noise intensity value. The noise intensity value refers to information that may reflect intensity of noise in an ambient environment, for example, it may be a noise sound pressure level, a noise signal intensity, or the like. In the example implementation, the acquisition module 1310 includes:

a first acquisition unit 1311, configured to acquire a noise intensity value of the ambient environment.

In an example implementation, the satisfying a predetermined condition includes that: the noise intensity value is greater than a predetermined threshold.

In an example implementation, the noise control message may include: the noise intensity value, the predetermined threshold and a transmit power value of the noise control message.

In an example implementation, the noise control message may include: the noise intensity value, the predetermined threshold and position information of a sender of the noise control message.

Figure 15:
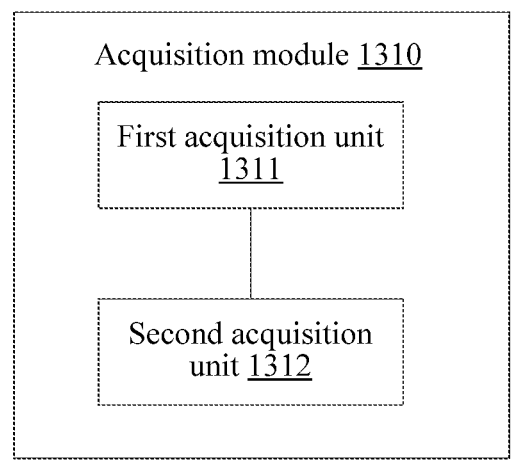
FIG. 15 is an example schematic diagram of a modular structure of an acquisition module in an implementation according to an embodiment of the present application.

In an example implementation, the noise control message may include: the noise intensity value, the predetermined threshold, noise sampling information and a corresponding sampling time. The noise sampling information and the sampling time may be acquired during acquisition of the noise information, that is to say, the noise information acquired from the noise of the ambient environment includes the noise sampling information and the sampling time. Referring to FIG. 15, in the example implementation, the acquisition module 1310 may further include:

a second acquisition unit 1312, configured to acquire noise sampling information and a corresponding sampling time from noise of the ambient environment.

Figure 16:
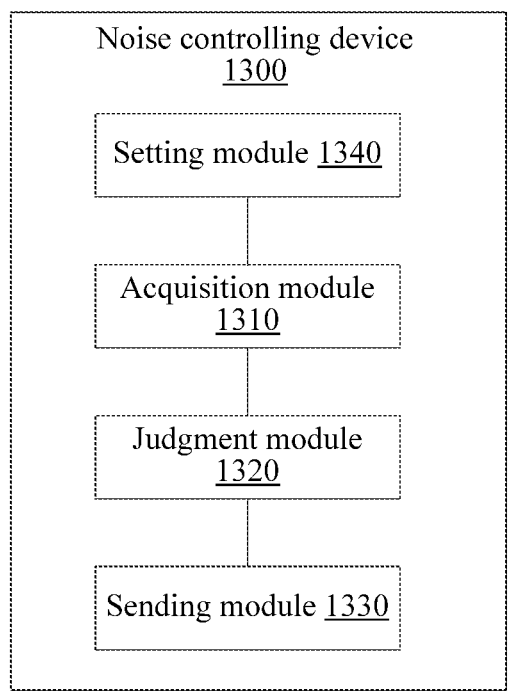
FIG. 16 is an example schematic diagram of a modular structure of a noise controlling device in an implementation according to an embodiment of the present application.

The noise information in the present application may be noise information corresponding to all collected sound frequencies. In addition, in another example implementation, the noise information may also be noise information of some specific sound frequency intervals, that is, noise information of at least one sound frequency interval. Referring to FIG. 16, in the example implementation, the device 1300 may further include:

a setting module 1340, configured to set at least one sound frequency interval according to user input, the noise information being noise information of at least one sound frequency interval.

Figure 17:
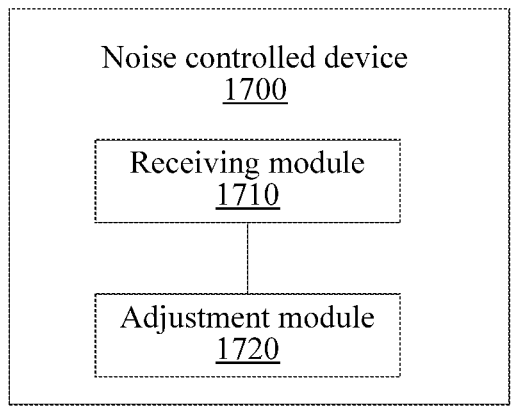
FIG. 17 is an example schematic diagram of a modular structure of a noise controlled device according to an embodiment of the present application.

FIG. 17 is a schematic diagram of a modular structure of a noise controlled device according to an embodiment of the present application; the noise controlled device may be, for example, a TV set, an audio device, a game console, a personal computer, a mobile phone and other devices that may make a loud sound.

Referring to FIG. 17, the controlled device 1700 may include:

a receiving module 1710, configured to receive a noise control message from an external device; and an adjustment module 1720, configured to adjust a volume based on a volume adjustment policy according to the noise control message and a current volume of the device.

The external refers to an external device.

Figure 18:
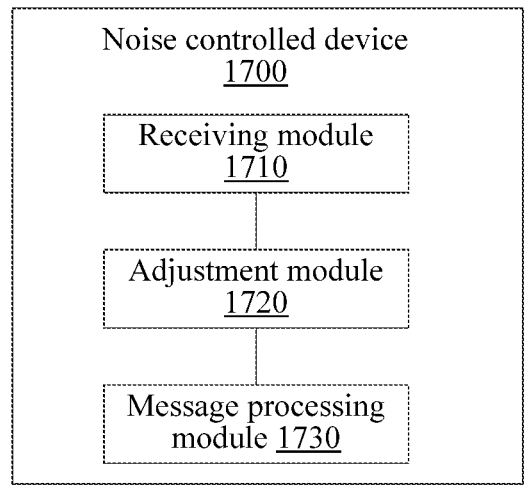
FIG. 18 is an example schematic diagram of a modular structure of a noise controlled device in an implementation according to an embodiment of the present application.

Referring to FIG. 18, in an example implementation, the device 1700 further includes:

a message processing module 1730, configured to extract a noise intensity value and a predetermined threshold from the noise control message.

In an example implementation, the message processing module 1730 is further configured to extract a transmit power value of the noise control message from the noise control message.

Figure 19:
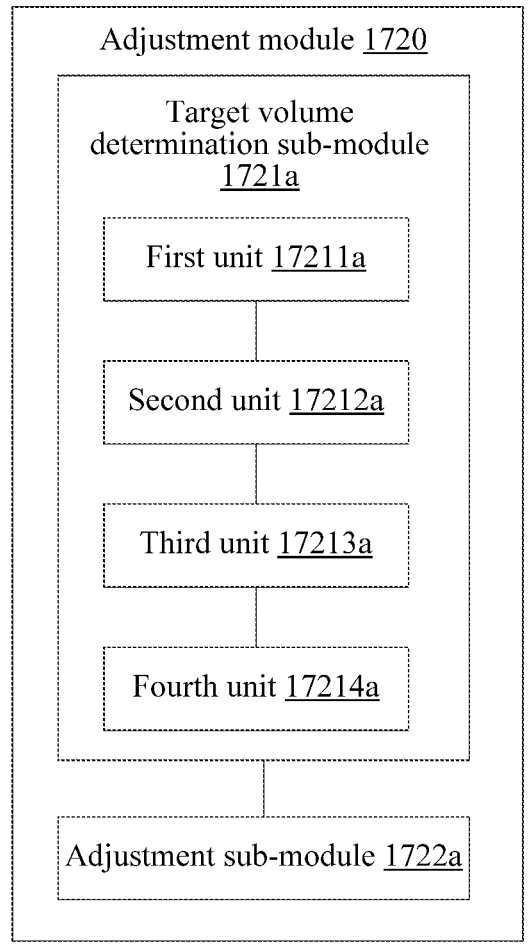
FIG. 19 is an example schematic diagram of a modular structure of an adjustment module in an implementation according to an embodiment of the present application.

Referring to FIG. 19, in the example implementation, the adjustment module 1720 may include:

a target volume determination sub-module 1721a, configured to determine a target volume according to the noise intensity value, the predetermined threshold, the current volume, the transmit power value and received signal intensity of the noise control message; and;

an adjustment sub-module 1722a, configured to adjust the volume according to the target volume.

The target volume determination sub-module 1721a may include:

a first unit 17211a, configured to obtain a wireless signal attenuation value according to the transmit power value and the received signal intensity;

a second unit 17212a, configured to obtain a first sub-noise intensity value in the noise intensity value according to the wireless signal attenuation value and the current volume;

a third unit 17213a, configured to obtain a second sub-noise intensity value according to the noise intensity value and the first sub-noise intensity value; and a fourth unit 17214a, configured to determine the target volume according to the predetermined threshold, the first sub-noise intensity value, the second sub-noise intensity value and the current volume.

Figure 20:
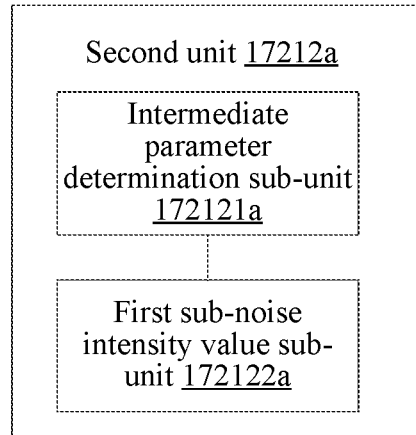
FIG. 20 is an example schematic diagram of a modular structure of a second unit in an implementation according to an embodiment of the present application.

Referring to FIG. 20, the second unit 17212a may include:

an intermediate parameter determination sub-unit 172121a, configured to determine an intermediate parameter according to the wireless signal attenuation value; and a first sub-noise intensity value sub-unit 172122a, configured to obtain the first sub-noise intensity value in the noise intensity value according to the intermediate parameter and the current volume.

In an example implementation, the message processing module 1730 is further configured to extract position information from the noise control message. The position information is position information of the external device.

Figure 21:
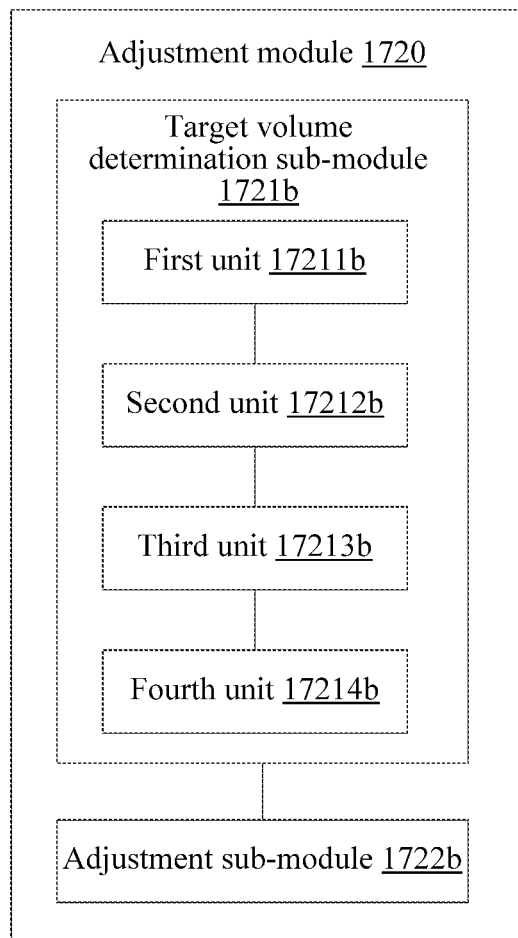
FIG. 21 is an example schematic diagram of a modular structure of an adjustment module in an implementation according to an embodiment of the present application.

Referring to FIG. 21, in the example implementation, the adjustment module 1720 may include:

a target volume determination sub-module 1721b, configured to determine a target volume according to the noise intensity value, the predetermined threshold, the current volume and the position information; and an adjustment sub-module 1722b, configured to adjust the volume according to the target volume.

The target volume determination sub-module may include:

a first unit 17211b, configured to determine a distance according to the position information;

a second unit 17212b, configured to obtain a first sub-noise intensity value in the noise intensity value according to the distance and the current volume;

a third unit 17213b, configured to obtain a second sub-noise intensity value according to the noise intensity value and the first sub-noise intensity value; and a fourth unit 17214b, configured to determine the target volume according to the predetermined threshold, the first sub-noise intensity value, the second sub-noise intensity value and the current volume.

In an example implementation, the message processing module 1730 is further configured to extract noise sampling information and a corresponding sampling time from the noise control message.

Figure 22:
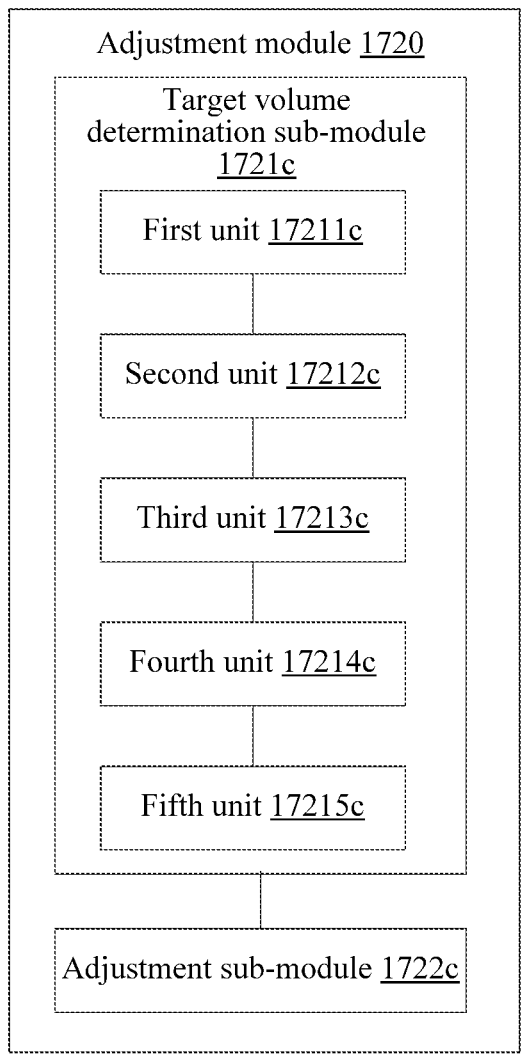
FIG. 22 is an example schematic diagram of a modular structure of an adjustment module in an implementation according to an embodiment of the present application.

Referring to FIG. 22, in the example implementation, the adjustment module 1720 includes:

a target volume determination sub-module 1721c, configured to determine a target volume according to the noise intensity value, the predetermined threshold, the current volume, the noise sampling information and the sampling time; and an adjustment sub-module 1722c, configured to adjust the volume according to the target volume.

The target volume determination sub-module includes:

a first unit 17211c, configured to match the noise sampling information with a sound output record of the device, to determine a sounding time of the noise sampling information;

a second unit 17212c, configured to determine a distance according to a time difference between the sampling time and the sounding time;

a third unit 17213c, configured to obtain a first sub-noise intensity value in the noise intensity value according to the distance and the current volume;

a fourth unit 17214c, configured to obtain a second sub-noise intensity value according to the noise intensity value and the first sub-noise intensity value; and a fifth unit 17215c, configured to determine the target volume according to the predetermined threshold, the first sub-noise intensity value, the second sub-noise intensity value and the current volume.

Figure 23:
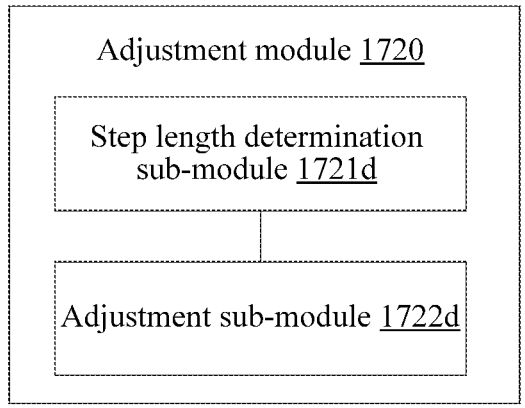
FIG. 23 is an example schematic diagram of a modular structure of an adjustment module in an implementation according to an embodiment of the present application.

Referring to FIG. 23, in an example implementation, the adjustment module 1720 includes:

a step length determination sub-module 1721d, configured to determine a step length according to the noise control message and a current volume of the device; and an adjustment sub-module 1722d, configured to adjust the volume according to the step length.

Figure 24:
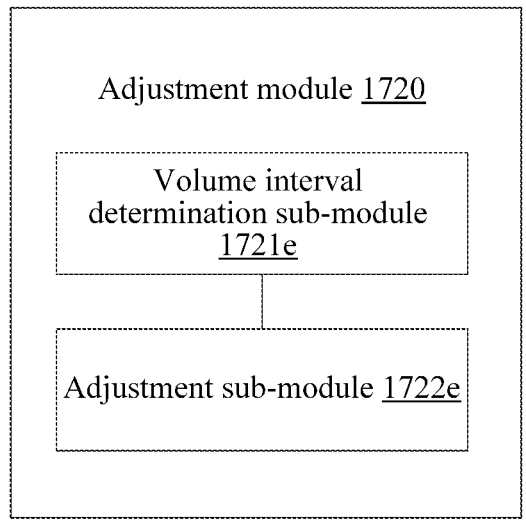
FIG. 24 is an example schematic diagram of a modular structure of an adjustment module in an implementation according to an embodiment of the present application.

Referring to FIG. 24, in the example implementation, the adjustment module 1720 includes:

a volume interval determination sub-module 1721e, configured to determine a volume interval according to the noise control message and a current volume of the device; and an adjustment sub-module 1722e, configured to control the volume to be within the volume interval.

Figure 25:
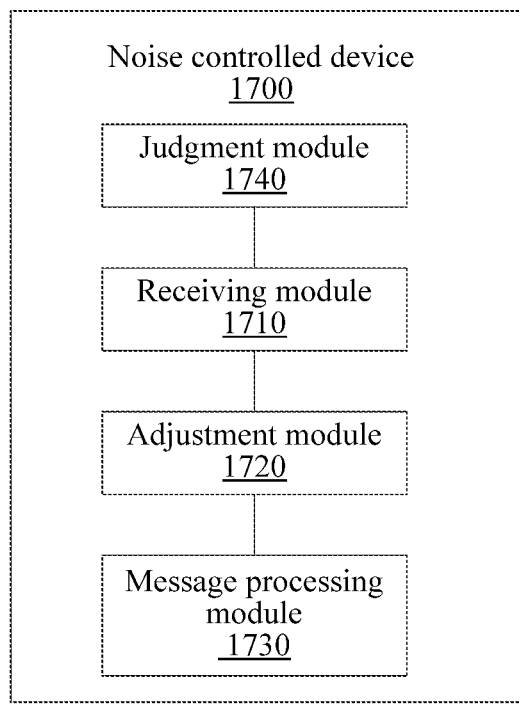
FIG. 25 is an example schematic diagram of a modular structure of a noise controlled device in an implementation according to an embodiment of the present application.

In consideration of demands for saving energy, the device does not need to operate all the time after the device has been turned on, but only needs to operate when the device is in a sounding state. Referring to FIG. 25, in another example implementation, the device 1700 may further include:

a judgment module 1740, configured to judge whether the device is making a sound, and if it is making a sound, enable the receiving module.

Figure 26:
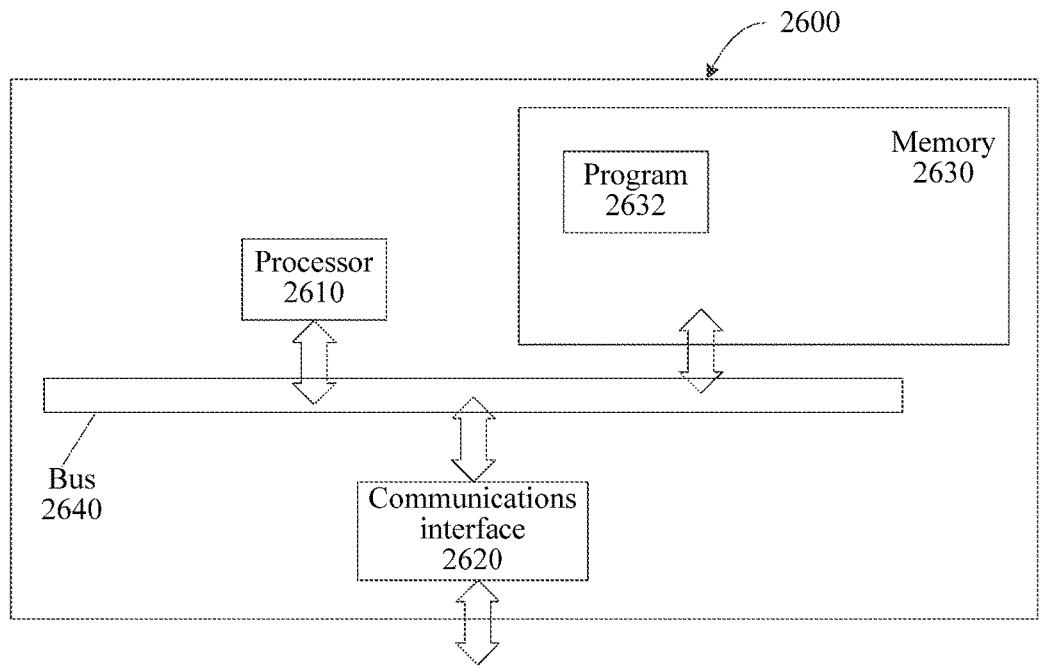
FIG. 26 is an example structural diagram of a noise controlling device according to an embodiment of the present application.

The structure of the noise controlling device according to one embodiment of the present application is shown in FIG. 26. The specific embodiment of the present application does not limit specific implementation of the noise controlling device; referring to FIG. 26, the noise controlling device 2600 may include:

a processor 2610, a communications interface 2620, a memory 2630, and a communications bus 2640.

The processor 2610, the communications interface 2620, and the memory 2630 implement mutual communications via the communications bus 2640.

The communications interface 2620 is configured to communicate with another network element.

The processor 2610 is configured to execute a program 2632, and may specifically implement relevant steps in the process embodiment shown in FIG. 9.

Specifically, the program 2632 may include a program code, the program code including a computer operation instruction.

The processor 2610 may be a central processing unit (CPU), or an application specific integrated circuit (ASIC), or be configured to be one or more integrated circuits which implement the embodiments of the present application.

The memory 2630 is configured to store the program 2632. The memory 2630 may include a high-speed RAM memory, and may also include a non-volatile memory, for example, at least one magnetic disk memory. The program 2632 may specifically execute the following steps:

acquiring noise information of an ambient environment; and judging whether the noise information satisfies a predetermined condition, and if yes, sending a noise control message to other devices, the noise control message being configured to notify the other devices to adjust a volume.

Reference may be made to the corresponding steps or modules in the foregoing embodiments for specific implementation of each step in the program 2632, which is not repeated herein. Those skilled in the art may clearly understand that, reference may be made to the corresponding description in the foregoing process embodiments for the particular working procedures of the devices and modules described above, and will not be repeated herein in order to make the description convenient and concise.

Figure 27:
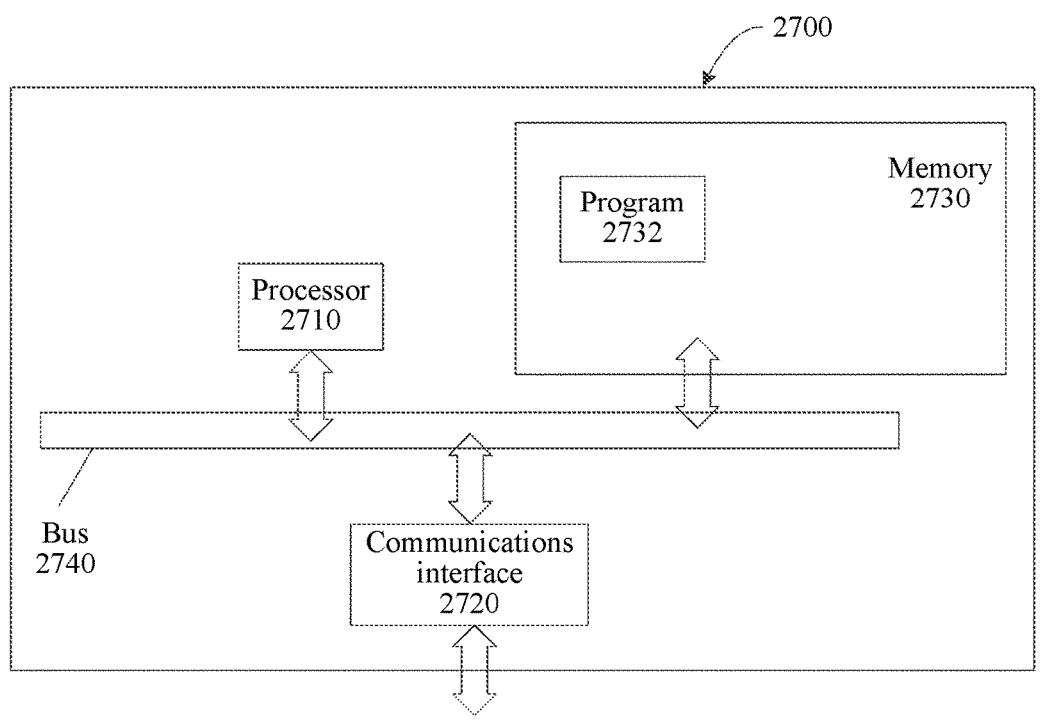
FIG. 27 is an example structural diagram of a noise controlled device according to an embodiment of the present application.

The structure of a noise controlled device according to an embodiment of the present application is shown in FIG. 27. The specific embodiment of the present application does not limit specific implementation of the noise controlled device; referring to FIG. 27, the noise controlled device 2700 may include:

a processor 2710, a communications interface 2720, a memory 2730, and a communications bus 2740.

The processor 2710, the communications interface 2720, and the memory 2730 implement mutual communications via the communications bus 2740.

The communications interface 2720 is configured to communicate with another network element.

The processor 2710 is configured to execute a program 2732, and may specifically implement relevant steps in the process embodiments shown in FIG. 1 to FIG. 12.

Specifically, the program 2732 may include a program code, the program code include a computer operation instruction.

The processor 2710 may be a central processing unit (CPU), or an application specific integrated circuit (ASIC), or be configured to be one or more integrated circuits which implement the embodiments of the present application.

The memory 2730 is configured to store the program 2732. The memory 2730 may include a high-speed RAM memory, and may also include a non-volatile memory, for example, at least one magnetic disk memory. The program 2732 may specifically execute the following steps:

receiving, by a device, a noise control message from an external device; and adjusting a volume based on a volume adjustment policy according to the noise control message and a current volume of the device.

Reference may be made to the corresponding steps or modules in the foregoing embodiments for specific implementation of each step in the program 2732, which is not repeated herein. Those skilled in the art may clearly understand that, reference may be made to the corresponding description in the foregoing process embodiments for the particular working procedures of the devices and modules described above, and will not be repeated herein in order to make the description convenient and concise.

It may be appreciated by those of ordinary skill in the art that each exemplary unit and method step described with reference to the embodiments disclosed herein may be implemented by electronic hardware or a combination of computer software and electronic hardware. Whether these functions are executed in a hardware mode or a software mode depends on particular applications and design constraint conditions of the technical solution. The professional technicians may use different methods to implement the functions described with respect to each particular application, but such implementation should not be considered to go beyond the scope of the present application.

If the functions are implemented in the form of a software functional unit and is sold or used as an independent product, it may be stored in a computer-readable storage medium. Based on such understanding, the technical solution of the present application essentially or the part which contributes to the prior art or a part of the technical solution may be embodied in the form of a software product, and the computer software product is stored in a storage medium, and includes several instructions for enabling a computer device (which may be a personal computer, a controller, a network device, or the like) to execute all or some steps of the method described in each embodiment of the present application. The foregoing storage medium includes various media which may store a program code, such as a USB disk, a mobile hard disk, a read-only memory (ROM), a random access memory (RAM), a magnetic disk, an optical disc, or the like.

The above embodiments are merely used to describe the present application, instead of limiting the present application; various alterations and variants may be made by those of ordinary skill in the art without departing from the spirit and scope of the present application, so all equivalent technical solutions also belong to the scope of the present application, and the scope of patent protection of the present application should be defined by claims.

What is claimed is:

1. A method, comprising:

receiving, by a device comprising a processor, a noise control message from an external device, wherein the noise control message comprises: a noise intensity value, a predetermined threshold, noise sampling information, and a corresponding sampling time; and adjusting a volume based on a volume adjustment policy based on the noise control message and a current volume of the device, wherein the adjusting the volume comprises:

determining a target volume based on the noise intensity value, the predetermined threshold, the current volume, the noise sampling information and the corresponding sampling time; and performing the adjusting of the volume based on the target volume, wherein the determining the target volume comprises:

matching the noise sampling information with a sound output record of the device to determine a sounding time of the noise sampling information;

determining a distance based on a time difference between the sampling time and the sounding time;

obtaining a first sub-noise intensity value in the noise intensity value based on the distance and the current volume;

obtaining a second sub-noise intensity value based on the noise intensity value and the first sub-noise intensity value; and determining the target volume based on the predetermined threshold, the first sub-noise intensity value, the second sub-noise intensity value and the current volume.

2. The method of claim 1, further comprising:

judging whether the device is making a sound, and if the device is determined to be making the sound, performing the receiving the noise control message from the external device.

3. The method of claim 1, wherein the noise control message further comprises:

a transmit power value of the noise control message.

4. The method of claim 3, wherein the adjusting the volume further comprises:

determining the target volume further based on the transmit power value and a received signal intensity of the noise control message.

5. The method of claim 4, wherein the determining the target volume further comprises:

obtaining a wireless signal attenuation value based on the transmit power value and the received signal intensity; and obtaining the first sub-noise intensity value in the noise intensity value further based on the wireless signal attenuation value.

6. The method of claim 5, wherein the obtaining the first sub-noise intensity value further comprises:

determining an intermediate parameter according to the wireless signal attenuation value; and obtaining the first sub-noise intensity value in the noise intensity value based on the intermediate parameter and the current volume.

7. The method of claim 1, wherein the noise control message further comprises:

position information.

8. The method of claim 7, wherein the adjusting the volume further comprises:

determining the target volume based on the noise intensity value, the predetermined threshold, the current volume, and the position information.

9. The method of claim 8, wherein the determining the target volume further comprises:
determining the distance further based on the position information.

10. The method of claim 1, wherein the noise intensity value comprises:
a noise sound pressure level or noise signal intensity.

11. The method of claim 1, wherein the adjusting the volume further comprises:
determining a step length according to the noise control message and the current volume of the device; and
adjusting the volume further based on the step length.

12. The method of claim 1, wherein the adjusting the volume further comprises:
determining a volume interval based on the noise control message and the current volume of the device; and
controlling the volume to be within the volume interval.

13. A device, comprising:
a processor, coupled to a memory, that executes or facilitates execution of executable modules, the executable modules comprising:
a receiving module configured to receive a noise control message from an external device;
a message processing module configured to extract a noise intensity value, a predetermined threshold, noise sampling information, and a corresponding sampling time from the noise control message; and
an adjustment module configured to adjust a volume based on a volume adjustment policy based on the noise control message and a current volume of the device, wherein the adjustment module comprises:
a target volume determination sub-module configured to determine a target volume based on the noise intensity value, the predetermined threshold, the current volume, the noise sampling information and the corresponding sampling time, wherein the target volume determination sub-module comprises:
a first unit configured to match the noise sampling information with a sound output record of the device, to determine a sounding time of the noise sampling information;
a second unit configured to determine a distance based on a time difference between the sampling time and the sounding time;
a third unit configured to obtain a first sub-noise intensity value in the noise intensity value based on the distance and the current volume;
a fourth unit configured to obtain a second sub-noise intensity value based on the noise intensity value and the first sub-noise intensity value; and
a fifth unit configured to determine the target volume based on the predetermined threshold, the first sub-noise intensity value, the second sub-noise intensity value and the current volume; and
an adjustment sub-module configured to adjust the volume based on the target volume.

14. The device of claim 13, wherein the executable modules further comprise:
a judgment module configured to determine whether the device is making a sound, and in response to the device being determined to be making the sound, enable the receiving module.

15. The device of claim 13, wherein the message processing module is further configured to extract a transmit power value of the noise control message from the noise control message.

16. The device of claim 15, wherein the target volume determination sub-module is further configured to determine the target volume based on the transmit power value and a received signal intensity of the noise control message.

17. The device of claim 16, wherein the target volume determination sub-module further comprises:
a sixth unit configured to obtain a wireless signal attenuation value based on the transmit power value and the received signal intensity, and
wherein the third unit is further configured to obtain the first sub-noise intensity value in the noise intensity value based on the wireless signal attenuation value and the current volume.

18. The device of claim 17, wherein the third unit comprises:
an intermediate parameter determination sub-unit configured to determine an intermediate parameter based on the wireless signal attenuation value; and
a first sub-noise intensity value sub-unit configured to obtain the first sub-noise intensity value in the noise intensity value based on the intermediate parameter and the current volume.

19. The device of claim 13, wherein the message processing module is further configured to extract position information from the noise control message.

20. The device of claim 19, wherein the target volume determination sub-module is further configured to determine the target volume based on the position information.

21. The device of claim 20, wherein the target volume determination sub-module further comprises:
wherein the second unit is further configured to determine the distance based on the position information.

22. The device of claim 13, wherein the adjustment module further comprises:
a step length determination sub-module configured to determine a step length based on the noise control message and the current volume of the device, and
wherein the adjustment sub-module is further configured to adjust the volume based on the step length.

23. The device of claim 13, wherein the adjustment module further comprises:
a volume interval determination sub-module configured to determine a volume interval based on the noise control message and the current volume of the device, and
wherein the adjustment sub-module is further configured to control the volume to be within the volume interval.

24. A television device, comprising:
a processor; and
a memory that stores executable instructions that, when executed by the processor, facilitate performance of operations, comprising:
receiving a noise control message from an external device, wherein the noise control message comprises: a noise intensity value and a predetermined threshold, noise sampling information, and a corresponding sampling time; and
adjusting a volume based on a volume adjustment policy based on the noise control message and a current volume of the television device, wherein the adjusting the volume comprises:
  determining a target volume based on the noise intensity value, the predetermined threshold, the current volume, the noise sampling information and the corresponding sampling time,
  wherein the adjusting the volume is based on the target volume, and
  wherein the determining the target volume comprises:
    matching the noise sampling information with a sound output record of the television device to determine a sounding time of the noise sampling information;
    determining a distance based on a time difference between the sampling time and the sounding time;
    obtaining a first sub-noise intensity value in the noise intensity value based on the distance and the current volume;
    obtaining a second sub-noise intensity value based on the noise intensity value and the first sub-noise intensity value; and
    determining the target volume based on the predetermined threshold, the first sub-noise intensity value, the second sub-noise intensity value and the current volume.

25. The television device of claim 24, wherein the external device is a mobile phone.

26. A computer readable storage device, comprising at least one executable instruction, which, in response to execution, causes a noise controlled device comprising a processor to perform operations, comprising:
  receiving, by the noise controlled device, a noise control message from an external device, wherein the noise control message comprises: a noise intensity value and a predetermined threshold, noise sampling information, and a corresponding sampling time; and
  adjusting a volume based on a volume adjustment policy based on the noise control message and a current volume of the device, wherein the adjusting the volume comprises:
    determining a target volume based on the noise intensity value, the predetermined threshold, the current volume, the noise sampling information and the corresponding sampling time; and
    performing the adjusting the volume based on the target volume, wherein the determining the target volume comprises:
      matching the noise sampling information with a sound output record of the device to determine a sounding time of the noise sampling information;
      determining a distance based on a time difference between the sampling time and the sounding time;
      obtaining a first sub-noise intensity value in the noise intensity value based on the distance and the current volume;
      obtaining a second sub-noise intensity value based on the noise intensity value and the first sub-noise intensity value; and
      determining the target volume based on the predetermined threshold, the first sub-noise intensity value, the second sub-noise intensity value and the current volume.

27. The computer readable storage device of claim 26, the operations further comprising:
  judging whether the device is making a sound, and if the device is determined to be making the sound, performing the receiving the noise control message from the external device.

28. The computer readable storage device of claim 26, wherein the noise control message further comprises:
  a transmit power value of the noise control message.

29. The computer readable storage device of claim 28, wherein the adjusting the volume further comprises:
  determining the target volume further based on the transmit power value and a received signal intensity of the noise control message.

30. The computer readable storage device of claim 29, wherein the determining the target volume further comprises:
  obtaining a wireless signal attenuation value based on the transmit power value and the received signal intensity; and
  obtaining the first sub-noise intensity value in the noise intensity value further based on the wireless signal attenuation value.

31. The computer readable storage device of claim 30, wherein the obtaining the first sub-noise intensity value further comprises:
  determining an intermediate parameter based on the wireless signal attenuation value; and
  obtaining the first sub-noise intensity value in the noise intensity value based on the intermediate parameter and the current volume.

32. The computer readable storage device of claim 26, wherein the noise control message further comprises position information.

33. The computer readable storage device of claim 32, wherein the adjusting the volume further comprises:
  determining the target volume based on the noise intensity value, the predetermined threshold, the current volume, and the position information.

34. The computer readable storage device of claim 33, wherein the determining the target volume further comprises:
  determining the distance further based on the position information.

35. The computer readable storage device of claim 26, wherein the noise intensity value comprises:
  a noise sound pressure level or a noise signal intensity.

36. The computer readable storage device of claim 26, wherein the adjusting the volume further comprises:
  determining a step length based on the noise control message and the current volume of the device; and
  adjusting the volume further according to the step length.

37. A noise controlled device for wireless communications, characterized by comprising a processor and a memory, the memory storing computer executable instructions, the processor being connected to the memory through a communication bus, and when the noise controlled device operates, the processor executes the computer executable instructions stored in the memory, so that the noise controlled device performs operations, comprising:
  receiving, by the noise controlled device, a noise control message from an external device, wherein the noise control message comprises: a noise intensity value and a predetermined threshold, noise sampling information, and a corresponding sampling time; and
  adjusting a volume based on a volume adjustment policy based on the noise control message and a current volume of the device wherein the adjusting the volume comprises:

determining a target volume based on the noise intensity value, the predetermined threshold, the current volume, the noise sampling information and the corresponding sampling time; and carrying out the adjusting of the volume based on the target volume, wherein the determining the target volume comprises:
matching the noise sampling information with a sound output record of the device to determine a sounding time of the noise sampling information;
determining a distance based on a time difference between the sampling time and the sounding time;
obtaining a first sub-noise intensity value in the noise intensity value based on the distance and the current volume;
obtaining a second sub-noise intensity value based on the noise intensity value and the first sub-noise intensity value; and
determining the target volume based on the predetermined threshold, the first sub-noise intensity value, the second sub-noise intensity value and the current volume.

38. The noise controlled device of claim 37, the operations further comprising:
judging whether the device is making a sound, and if the device is determined to be making the sound, performing the receiving the noise control message from the external device.

39. The noise controlled device of claim 37, wherein the noise control message further comprises:
a transmit power value of the noise control message.

40. The noise controlled device of claim 39, wherein the adjusting the volume further comprises:
determining the target volume further based on the transmit power value and a received signal intensity of the noise control message.

41. The noise controlled device of claim 40, wherein the determining the target volume further comprises:
obtaining a wireless signal attenuation value based on the transmit power value and the received signal intensity; and
obtaining the first sub-noise intensity value in the noise intensity value further based on the wireless signal attenuation value.

42. The noise controlled device of claim 41, wherein the obtaining the first sub-noise intensity value further comprises:
determining an intermediate parameter based on the wireless signal attenuation value; and
obtaining the first sub-noise intensity value in the noise intensity value based on the intermediate parameter and the current volume.

43. The noise controlled device of claim 37, wherein the noise control message further comprises position information.

44. The noise controlled device of claim 43, wherein the adjusting the volume further comprises:
determining the target volume based on the noise intensity value, the predetermined threshold, the current volume, and the position information.

45. The noise controlled device of claim 44, wherein the determining the target volume further comprises:
determining the distance further based on the position information.

46. The noise controlled device of claim 37, wherein the noise intensity value comprises:
a noise sound pressure level or a noise signal intensity.

47. The noise controlled device of claim 37, wherein the adjusting the volume further comprises:
determining a step length according to the noise control message and the current volume of the device; and
adjusting the volume further based on the step length.

48. The noise controlled device of claim 37, wherein the adjusting the volume further comprises:
determining a volume interval based on the noise control message and the current volume of the device; and
controlling the volume to be within the volume interval.

49. A game console device, comprising:
a processor; and
a memory that stores executable instructions that, when executed by the processor, facilitate performance of operations, comprising:
a receipt of a noise control message from an external device, wherein the noise control message comprises: a noise intensity value, a predetermined threshold, noise sampling information, and a corresponding sampling time; and
an adjustment of a volume based on a volume adjustment policy based on the noise control message and a current volume of the game console device,
wherein the adjustment of the volume comprises:
a determination of a target volume based on the noise intensity value, the predetermined threshold, the current volume, the noise sampling information and the corresponding sampling time,
wherein the adjustment of the volume is based on the target volume, and
wherein the determination of the target volume comprises:
a matching of the noise sampling information with a sound output record of the game console device to determine a sounding time of the noise sampling information;
a determination of a distance based on a time difference between the sampling time and the sounding time;
an obtaining of a first sub-noise intensity value in the noise intensity value based on the distance and the current volume;
an obtaining of a second sub-noise intensity value according to the noise intensity value and the first sub-noise intensity value; and
the determination of the target volume based on the predetermined threshold, the first sub-noise intensity value, the second sub-noise intensity value and the current volume.

50. An audio system, comprising:
a processor; and
a memory that stores executable instructions that, when executed by the processor, facilitate performance of operations, comprising:
receiving a noise control message from an external device, wherein the noise control message comprises: a noise intensity value, a predetermined threshold, noise sampling information, and a corresponding sampling time; and
adjusting a volume based on a volume adjustment policy based on the noise control message and a current volume of the audio system, wherein the adjusting the volume comprises:
determining a target volume based on the noise intensity value, the predetermined threshold, the current volume, the noise sampling information and the corresponding sampling time; and performing the adjusting of the volume based on the target volume, wherein the determining the target volume comprises:

matching the noise sampling information with a sound output record of the audio system to determine a sounding time of the noise sampling information;

determining a distance based on a time difference between the sampling time and the sounding time;

obtaining a first sub-noise intensity value in the noise intensity value based on the distance and the current volume;

obtaining a second sub-noise intensity value based on the noise intensity value and the first sub-noise intensity value; and performing the determining of the target volume based on the predetermined threshold, the first sub-noise intensity value, the second sub-noise intensity value and the current volume.

51. The audio system of claim 24, wherein the external device is a mobile phone.

* * * * *